United States Patent
Lower et al.

(10) Patent No.: US 11,108,374 B1
(45) Date of Patent: Aug. 31, 2021

(54) VERTICALLY INTEGRATED CIRCUIT ASSEMBLY

(71) Applicant: Rockwell Collins, Inc., Cedar Rapids, IA (US)

(72) Inventors: Nathan P. Lower, North Liberty, IA (US); Joseph M. Bohl, Cedar Rapids, IA (US); Tyler J. Wilson, Springville, IA (US); Peter M. Sahayda, Cedar Rapids, IA (US); David L. Westergren, Marion, IA (US); Lucas J. Lower, Parnell, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 88 days.

(21) Appl. No.: 16/673,139

(22) Filed: Nov. 4, 2019

(51) Int. Cl.
*H03H 9/05* (2006.01)
*H03H 9/70* (2006.01)
*H03H 9/46* (2006.01)
*H03H 9/08* (2006.01)

(52) U.S. Cl.
CPC ............ *H03H 9/0547* (2013.01); *H03H 9/08* (2013.01); *H03H 9/46* (2013.01); *H03H 9/70* (2013.01)

(58) Field of Classification Search
CPC .......... H03H 9/0547; H03H 9/70; H03H 9/46; H03H 9/08
USPC ....................................................... 333/133
See application file for complete search history.

(56) References Cited

U.S. PATENT DOCUMENTS

| | | | |
|---|---|---|---|
| 7,675,154 B2 | 3/2010 | Hong et al. | |
| 7,830,021 B1 | 11/2010 | Wilcoxon et al. | |
| 8,451,073 B2 | 5/2013 | Hoeft et al. | |
| 9,515,002 B2* | 12/2016 | Gandhi | ................... H01L 21/78 |
| 2015/0123744 A1* | 5/2015 | Nishimura | ........... H03H 9/1007 333/133 |
| 2018/0097505 A1 | 4/2018 | Darling et al. | |

FOREIGN PATENT DOCUMENTS

| | | |
|---|---|---|
| EP | 1127031 B1 | 8/2001 |
| EP | 3416232 A1 | 12/2018 |
| WO | 2017004417 A1 | 1/2017 |

* cited by examiner

*Primary Examiner* — Robert J Pascal
*Assistant Examiner* — Jorge L Salazar, Jr.
(74) *Attorney, Agent, or Firm* — Suiter Swantz pc llo (57) ABSTRACT

A vertically integrated circuit assembly may include a substrate including a plurality of electrical traces, and a first circuit assembly layer disposed on the substrate. In embodiments, the first circuit assembly layer includes a first set of integrated circuit components, and a plurality of electrical interconnects configured to route signals through the first circuit assembly layer. In embodiments, the vertically integrated circuit assembly further includes a second circuit assembly layer coupled to the top surface of the first circuit assembly layer. The second circuit assembly layer may include a second set of integrated circuit components, and a plurality of electrical interconnects configured to route signals through the second circuit assembly layer. In embodiments, an electrical interconnect arrangement on a top surface of the first circuit assembly layer is configured to interface with an electrical interconnect arrangement on the bottom surface of the second circuit assembly layer.

20 Claims, 5 Drawing Sheets

VERTICALLY INTEGRATED CIRCUIT ASSEMBLY

BACKGROUND

Conventional radio frequency (RF) multiplexers and other integrated circuit (IC) assemblies typically require many tuning elements, including filters. Additionally, conventional IC assemblies (e.g., multiplexers) and are physically large, and are arranged in a planar topology. In this regard, the multiple components of conventional IC assemblies occupy large amounts of area on a substrate (e.g., printed circuit board). The increased physical separation between the components (e.g., filters) of conventional IC assemblies increases the parasitic effects associated with interconnections between the components, thereby contributing to loss and detuning of the IC assemblies. Furthermore, because the size (and therefore parasitic effects) of conventional IC assemblies inherently increases with complexity, existing IC assembly (e.g., multiplexer) topologies inhibit system performance, and are ill-suited to accommodate increasingly complex circuit assemblies.

SUMMARY

A vertically integrated circuit assembly is disclosed. In embodiments, the vertically integrated circuit assembly includes a substrate including a plurality of electrical traces, and a first circuit assembly layer disposed on the substrate. In embodiments, the first circuit assembly layer includes a first set of integrated circuit components, and a plurality of electrical interconnects configured to route signals through the first circuit assembly layer, wherein the plurality of electrical interconnects form an electrical interconnect arrangement on a top surface of the first circuit assembly layer. In embodiments, the vertically integrated circuit assembly further includes a second circuit assembly layer coupled to the top surface of the first circuit assembly layer. The second circuit assembly layer may include a second set of integrated circuit components, and a plurality of electrical interconnects configured to route signals through the second circuit assembly layer, the plurality of electrical interconnects forming an electrical interconnect arrangement on a bottom surface of the second circuit assembly layer configured to interface with the electrical interconnect arrangement on the top surface of the first circuit assembly layer.

In some embodiments of the vertically integrated circuit assembly, the plurality of electrical interconnects of the second circuit assembly layer also form an electrical interconnect arrangement on a top surface of the second circuit assembly layer.

In some embodiments of the vertically integrated circuit assembly, the vertically integrated circuit assembly further includes at least one additional circuit assembly layer coupled to the top surface of the second circuit assembly layer, wherein the at least one additional circuit assembly layer includes: at least one additional set of integrated circuit components; and a plurality of electrical interconnects configured to route signals through the at least one additional circuit assembly layer, the plurality of electrical interconnects forming an electrical interconnect arrangement on a bottom surface of the at least one additional circuit assembly layer configured to interface with the electrical interconnect arrangement on the top surface of the second circuit assembly layer.

In some embodiments of the vertically integrated circuit assembly, the at least one additional circuit assembly layer includes a top circuit assembly layer, wherein the at least one additional circuit assembly layer includes at least one of a finned heat sink, a heat pipe, or a thermal spreader.

In some embodiments of the vertically integrated circuit assembly, the first set of integrated circuit components are configured to receive an input signal via a first electrical trace of the plurality of electrical traces, and transmit a first output signal via a second electrical trace of the plurality of electrical traces.

In some embodiments of the vertically integrated circuit assembly, the second set of integrated circuit components are configured to receive the input signal via a first electrical interconnect of the first circuit assembly layer, and transmit a second output signal via a second electrical interconnect of the first circuit assembly layer to a third electrical trace of the plurality of electrical traces.

In some embodiments of the vertically integrated circuit assembly, the first output signal includes a first bandwidth, and the second output signal includes a second bandwidth different from the first bandwidth.

In some embodiments of the vertically integrated circuit assembly, the vertically integrated circuit assembly includes a vertically integrated radio frequency multiplexer.

In some embodiments of the vertically integrated circuit assembly, the first circuit assembly layers includes a first bandpass filter layer, and the second circuit assembly layer includes a second bandpass filter layer.

In some embodiments of the vertically integrated circuit assembly, the second circuit assembly layer is coupled to the top surface of the first circuit assembly layer via one or more transient liquid phase bonding processes.

In some embodiments of the vertically integrated circuit assembly, the second circuit assembly layer is coupled to the top surface of the first circuit assembly layer via at least one of a conductive epoxy, sintered silver, or solder.

In some embodiments of the vertically integrated circuit assembly, at least one of the first set of integrated circuit components or the second set of integrated circuit components include a power amplifier.

In some embodiments of the vertically integrated circuit assembly, at least one of the first set of integrated circuit components or the second set of integrated circuit components include at least one of a switch or a bypass component.

In some embodiments of the vertically integrated circuit assembly, wherein an exterior perimeter of the second circuit assembly layer conforms to an exterior perimeter of the first circuit assembly layer.

A vertically integrated circuit assembly is disclosed. In embodiments, the vertically integrated circuit assembly includes a substrate including a plurality of electrical traces, and a plurality of circuit assembly layers vertically stacked on a substrate. In embodiments, each circuit assembly layer of the plurality of circuit assembly layers includes a set of integrated circuit components, and a plurality of electrical interconnects configured to route signals through the respective circuit assembly layer. In some embodiments, the plurality of electrical interconnects may form an electrical interconnect arrangement on a top surface of the respective circuit assembly layer and an electrical interconnect arrangement on a bottom surface of the respective circuit assembly layer such that an electrical interconnect arrangement on a bottom surface of an Nth circuit assembly layer disposed on top of an N−1 circuit assembly layer interfaces with an electrical interconnect arrangement on a top surface of the N−1 circuit assembly layer.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are provided for example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination of sub-combination of two or more such features, along with any other features which may not necessarily be expressly described or inherently present in the instant disclosure.

Reference will now be made in detail to the subject matter disclosed, which is illustrated in the accompanying drawings.

Figure 1:
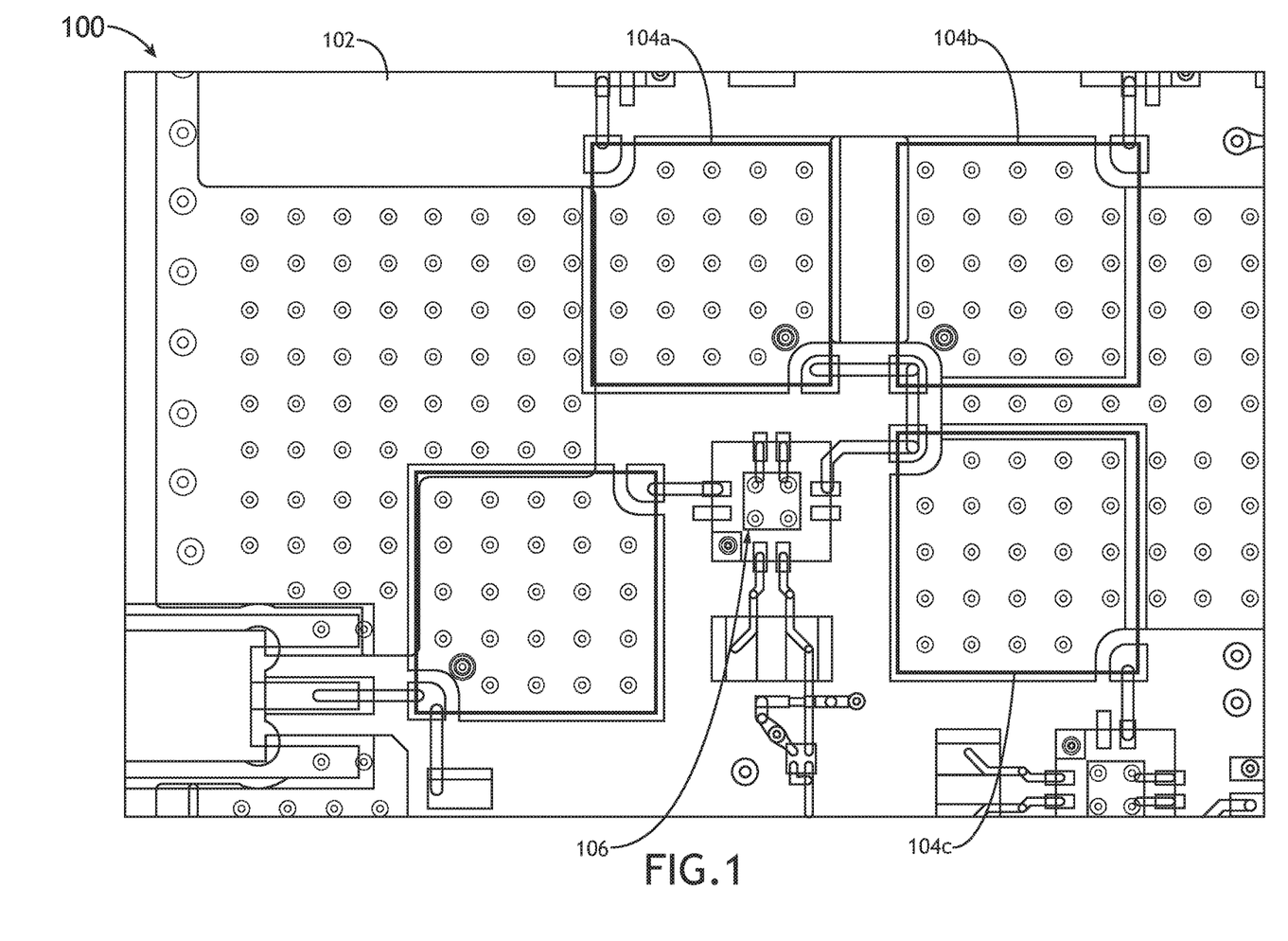
FIG. 1 illustrates top view of a multiplexer.

FIG. 1 illustrates top view of a multiplexer 100. In particular, the multiplexer 100 depicted in FIG. 1 is shown as an example integrated circuit device according to conventional planar topologies for integrated circuit devices. It is contemplated herein that a brief description of multiplexer 100 may provide a reference point against which attendant advantages of the present disclosure may be compared.

Conventional radio frequency (RF) multiplexers and other integrated circuit (IC) assemblies typically require many tuning elements, including filters. Additionally, conventional IC assemblies (e.g., multiplexers) and are physically large, and are arranged in a planar topology. For example, as shown in FIG. 1, a multiplexer 100 may include a plurality of integrated circuit components disposed on a printed circuit board 102. For instance, the multiplexer 100 may include a first bandpass filter 104a, a second bandpass filter 104b, a third bandpass filter 104c, and an amplifier 106 disposed on the printed circuit board 102.

As shown in FIG. 1, due to the planar topology of the multiplexer 100, the components of the multiplexer 100 occupy large amounts of area on the printed circuit board 102. For example, each of the bandpass filters 104a, 104b, 104c may be fabricated to a size of approximately 5 mm×5 mm×1 mm. In this example, the footprint of each individual bandpass filter 104a, 104b, 104c is approximately 25 mm$^2$ (5 mm×5 mm=25 mm$^2$). In the planar topology, interconnections between the various components may be as large as 10-15 mm. Accordingly, the multiplexer 100 exhibiting a planar topology illustrated in FIG. 1 may include a total footprint of approximately 225 mm$^2$ (15 mm×15 mm=225 mm$^2$).

The increased physical separation between the components of the multiplexer 100 (e.g., bandpass filters 104a, 104b, 104c, amplifier 106) may increase the parasitic effects associated with interconnections between the respective components, thereby contributing to loss and detuning of the multiplexer 100. Furthermore, because the size (and therefore parasitic effects) of the multiplexer 100 will inherently increase with complexity, existing multiplexer 100 topologies inhibit system performance, and are ill-suited to accommodate increasingly complex integrated circuit assemblies.

Accordingly, embodiments of the present disclosure are directed to a system and method which cure one or more of the shortfalls of the previous approaches identified above. Embodiments of the present disclosure are directed to a vertically integrated circuit assembly. In particular, some embodiments of the present disclosure are directed to a vertically integrated radio frequency (RF) multiplexer assembly. Additional embodiments of the present disclosure are directed to a plurality of circuit assembly layers including electrical interconnect arrangements configured to interface one another such that the plurality of circuit assembly layers may be stacked to form a vertically integrated circuit assembly.

It is contemplated herein that embodiments of the present disclosure may enable increased integrated circuit complexity, while simultaneously reducing the overall footprint of the integrated circuit assemblies. Additionally, by vertically stacking layers of a vertically integrated circuit assembly, integrated circuit components may be positioned in closer proximity than is possible with a planar topology, which may thereby reduce parasitic losses, and reduce/minimize detuning effects.

Figure 2:
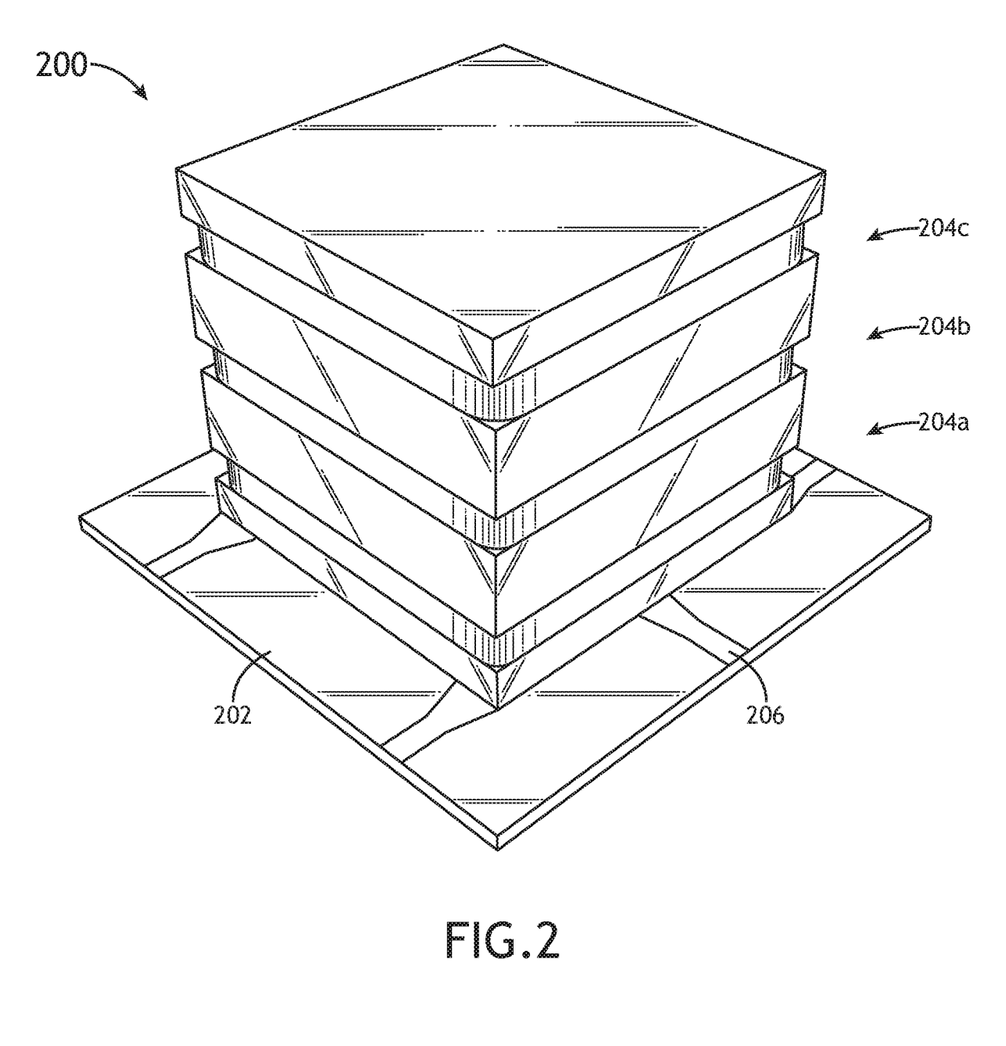
FIG. 2 illustrates a perspective view of a vertically integrated circuit assembly, in accordance with one or more embodiments of the present disclosure.

FIG. 2 illustrates a perspective view of a vertically integrated circuit assembly 200, in accordance with one or more embodiments of the present disclosure. The vertically integrated circuit assembly 200 may include, but is not limited to, a substrate 202, a first circuit assembly layer 204a, a second circuit assembly layer 204b, and a third circuit assembly layer 204c.

The substrate 202 may include any substrate known in the art including, but not limited to, a printed circuit board (PCB). In embodiments, the vertically integrated circuit assembly 200 may further include, but is not limited to, one or more electrical traces 206 disposed on the substrate 202. The one or more electrical traces 206 may be electrically coupled to the various circuit assembly layers 204a-204c. In this regard, the one or more electrical traces 206 may be configured to transmit input signals to the vertically integrated circuit assembly 200, and receive output signals from the vertically integrated circuit assembly 200 which may be routed to various other components/integrated circuit devices.

In embodiments, integrated circuit elements (e.g., circuit assembly layers 204a-204c) may be vertically stacked on top of one another in order to reduce the overall footprint of the vertically integrated circuit assembly 200 and to enable increased complexity of integrated circuit devices. For example, the vertically integrated circuit assembly 200 may include a first circuit assembly layer 204a disposed on the substrate 202, a second circuit assembly layer 204b disposed on top of the first circuit assembly layer 204b, and a third circuit assembly layer 204c disposed on top of the second circuit assembly layer 204b. The various circuit assembly layers 204a-204c may be fabricated using any material known in the art. In some embodiments, the various circuit assembly layers 204a-204c may be fabricated using one or more high thermal conductivity materials in order to enhance thermal management within the vertically integrated circuit assembly 200. For example, the various circuit assembly layers 204a-204c may be fabricated from a thermally conductive semiconductor material.

While FIG. 2 illustrates a vertically integrated circuit assembly 200 including three distinct circuit assembly layers 204a-204c, this is not to be regarded as a limitation of the present disclosure, unless otherwise noted herein. In this regard, the vertically integrated circuit assembly 200 may include any N number of layers, wherein the Nth circuit assembly layer 204n is disposed on top of the N−1 circuit assembly layer 204n−1, which may be disposed on top of the N−2 circuit assembly layer 204n−2, and the like. For example, the vertically integrated circuit assembly 200 may include a first circuit assembly layer 204a disposed on the substrate 202, a second circuit assembly layer 204b disposed on the first circuit assembly layer 204a . . . and an Nth circuit assembly layer 204n is disposed on top of the N−1 circuit assembly layer 204n−1.

Vertically stacking respective layers (e.g., circuit assembly layers 204a-204n) on top of one another may substantially reduce the overall footprint of increasingly complex integrated circuit devices (e.g., multiplexer 100). For example, bandpass filters may be fabricated using various fabrication processes (e.g., Z-fab) such that each bandpass filter is sized approximately 5 mm×5 mm×1 mm. In the context of a multiplexer with four separate bandpass filters arranged in a planar topology (as shown in FIG. 1), the smallest possible footprint of the multiplexer would be approximately 200 mm$^2$, after accounting for interconnects between each bandpass filter. Comparatively, by stacking the four separate bandpass filters (e.g., four separate circuit assembly layers 204) in a vertical topology (as shown in FIG. 2), the smallest possible footprint of the multiplexer would be approximately 25 mm$^2$ (5 mm×5 mm=25 mm$^2$). Comparing the respective footprints, it may be seen that embodiments of the present disclosure may substantially decrease the overall footprint of a vertically integrated circuit assembly 200 as compared to the multiplexer 100 arranged in a planar topology. It has been found that embodiments of the present disclosure may enable approximately a 10× reduction in required substrate 202 footprint.

In addition to decreasing the overall footprint of integrated circuit devices, the vertical topology of the vertically integrated circuit assembly 200 may additionally decrease the physical separation (e.g., interconnect length) of various components of the vertically integrated circuit assembly 200. For example, as noted previously herein, the planar topology of the multiplexer 100 may result in large interconnect lengths of approximately 10-15 mm between respective components. Comparatively, the vertical topology of the vertically integrated circuit assembly 200 may reduce the interconnect length between components to approximately 3 mm. By significantly reducing the interconnect lengths between components, the vertically integrated circuit assembly 200 may reduce parasitic loss, reduce detuning effects, improve power dissipation, and improve overall efficiency of the vertically integrated circuit assembly 200.

Figure 3A:
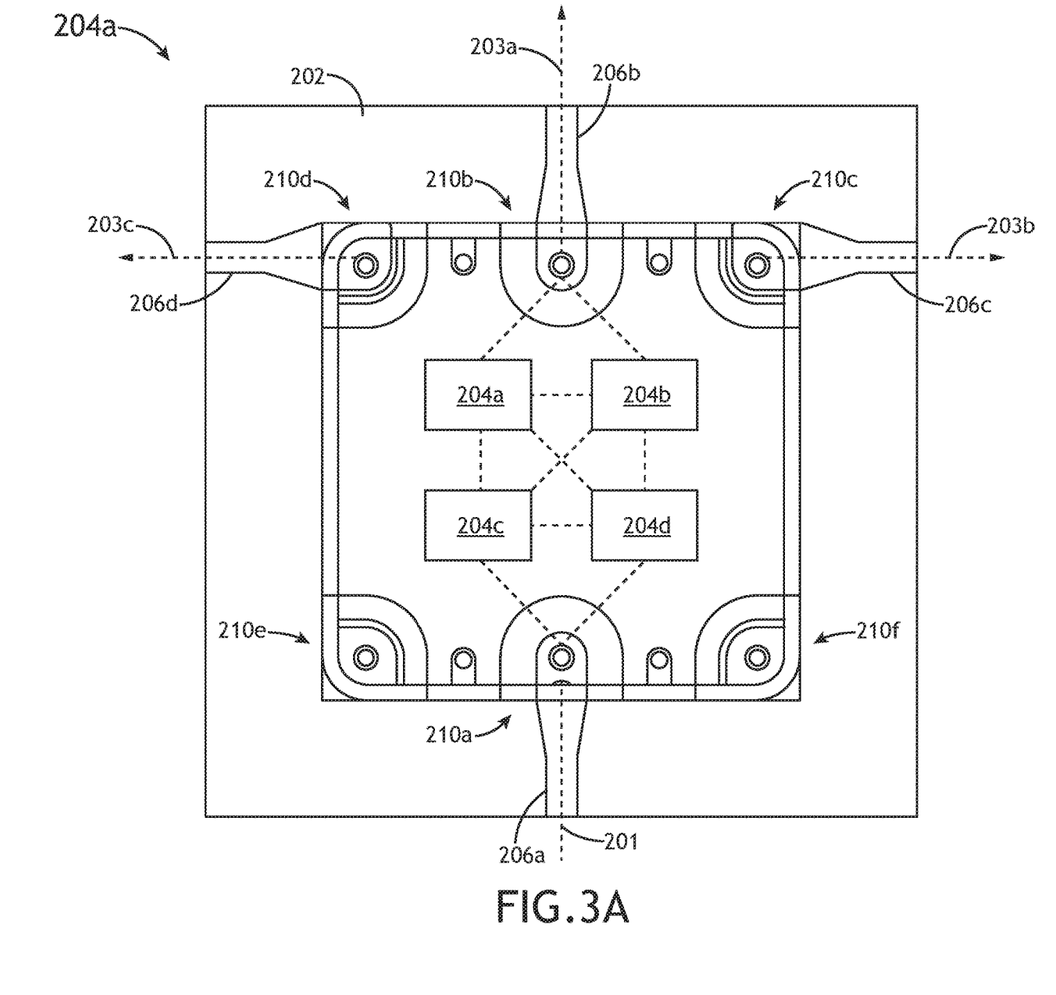
FIG. 3A illustrates a top view of a first circuit assembly layer of a vertically integrated circuit assembly, in accordance with one or more embodiments of the present disclosure.
Figure 3B:
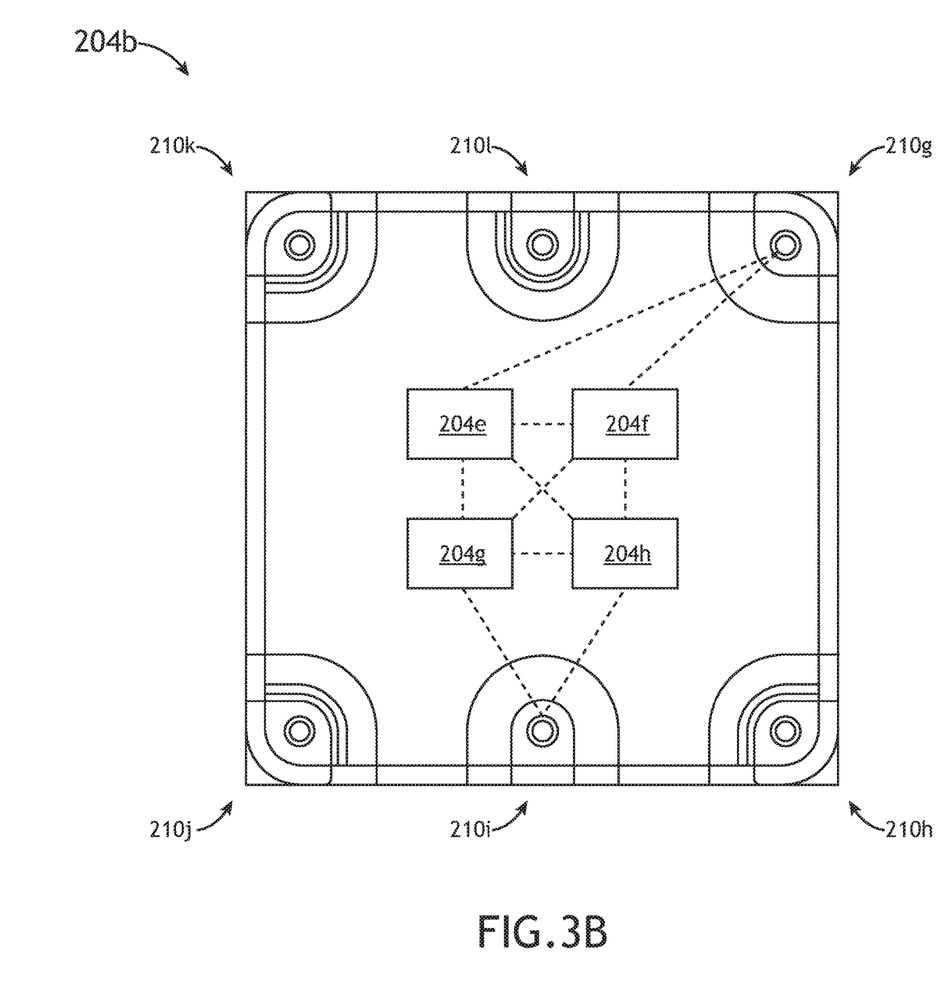
FIG. 3B illustrates a top view of a second circuit assembly layer of a vertically integrated circuit assembly, in accordance with one or more embodiments of the present disclosure.
Figure 3C:
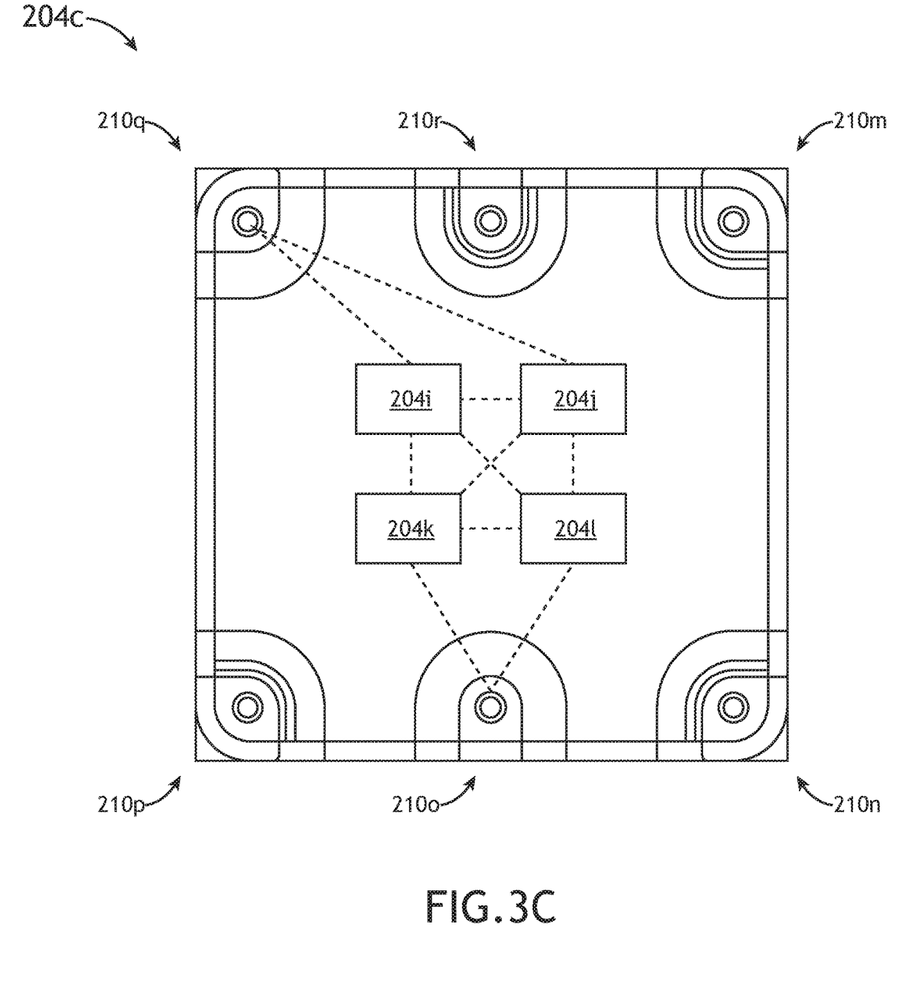
FIG. 3C illustrates a top view of a third circuit assembly layer of a vertically integrated circuit assembly, in accordance with one or more embodiments of the present disclosure.

FIG. 3A illustrates a top view of a first circuit assembly layer 204a of a vertically integrated circuit assembly 200, in accordance with one or more embodiments of the present disclosure. FIG. 3B illustrates a top view of a second circuit assembly layer 204b of a vertically integrated circuit assembly 200, in accordance with one or more embodiments of the present disclosure. FIG. 3C illustrates a top view of a third circuit assembly layer 204c of a vertically integrated circuit assembly 200, in accordance with one or more embodiments of the present disclosure.

In embodiments, each circuit assembly layer 204a-204c may include a set of one or more integrated circuit components. For example, the first circuit assembly layer 204a may include a set of integrated circuit components 208a-208d, the second circuit assembly layer 204b may include a set of integrated circuit components 208e-208h, and the third circuit assembly layer 204c may include a set of integrated circuit components 208i-208l. The integrated circuit components 208 of the various circuit assembly layers 204a-204c may include any integrated circuit components known in the art. For example, the integrated circuit components 208 may include one or more passive components including, but not limited to, RF filters, switches, bypass components, phase shift components/materials, thermal management components, and the like. By way of another example, the integrated circuit components 208 may include one or more active components including, but not limited to, power amplifiers, pulsed power amplifiers, radiating elements, and the like.

For instance, in some embodiments, the vertically integrated circuit assembly 200 may include a vertically integrated RF multiplexer. In this regard, the first circuit assembly layer 204a may include integrated circuit components 208a-208d such that the first circuit assembly layer 204a includes a first bandpass filter layer. Similarly, the second circuit assembly layer 204b may include integrated circuit components 208e-208h such that the second circuit assembly layer 204b includes a second bandpass filter layer, and the third circuit assembly layer 204c may include integrated circuit components 208i-208l such that the third circuit assembly layer 204c includes a third bandpass filter layer.

While much of the present disclosure focuses on the vertically integrated circuit assembly 200 in the context of radio frequency (RF) (e.g., RF multiplexer), this is not to be regarded as a limitation of the present disclosure. In this regard, the integrated circuit components 208 may include components configured for additional and/or alternative contexts, such as digital control hardware.

In embodiments, the first circuit assembly layer 204a may be disposed on the substrate 202. For example, in some embodiments, the first circuit assembly layer 204a may include a separate layer from the substrate 202 such that the first circuit assembly layer 204a is disposed on a top surface of the substrate 202. By way of another example, in additional and/or alternative embodiments, the first circuit assembly layer 204a may include a portion of the substrate 202 such that the set of integrated circuit components 208a-208d are disposed on the top surface of the substrate 202.

In embodiments, each circuit assembly layer 204a-204c may include a plurality of electrical interconnects 210. The plurality of electrical interconnects 210 may be configured to electrically couple the various layers of the vertically integrated circuit assembly 200. In this regard, the plurality of electrical interconnects 210 may be configured to route electricity/signals through each respective circuit assembly layer 204a-204c. Additionally, the plurality of electrical interconnects 210 may be configured to electrically couple the various integrated circuit components 208a-208l of the vertically integrated circuit assembly 200 to the electrical traces 206 disposed on the substrate 202.

For example, as shown in FIG. 3A, the first circuit assembly layer 204a may include a plurality of electrical interconnects 210a-210f. For instance, a first electrical interconnect 210a may be configured to electrically couple a first electrical trace 206a of the substrate 202 to the set of integrated circuit components 208a-208d. By way of another example, a second electrical interconnect 210b may be configured to electrically couple a second electrical trace 206a of the substrate 202 to the set of integrated circuit components 208a-208d.

In embodiments, the plurality of electrical interconnects 210a-210b of the first circuit assembly layer 204a form an electrical interconnect arrangement (e.g., electrical interconnect pattern, configuration, array, and the like) on a top surface of the first circuit assembly layer 204a. For example, as shown in FIG. 3A, the plurality of electrical interconnects 210a-210b may be disposed within the first circuit assembly layer 204a such that an electrical interconnect arrangement is formed on the top surface of the first circuit assembly layer 204a. The electrical interconnect arrangement shown in FIG. 3A may include electrical interconnects 210c-210f in each corner of the first circuit assembly layer 204a, and electrical interconnects 210a-210b disposed at a midpoint of two sides of the first circuit assembly layer 204a. It is noted herein that the electrical interconnects 210a-210n of the vertically integrated circuit assembly 200 may be formed from any conductive material known in the art configured to facilitate electrical conductivity including, but not limited to, conductive metals (e.g., gold, copper), conductive semiconductor materials, conductive ceramics, and the like. Similarly, it is noted herein that the electrical interconnects 210a-210n may take any form known in the art configured to electrically couple the various circuit assembly layers 204a-204c of the vertically integrated circuit assembly 200 including, but not limited to, bond pads, pins, and the like.

It is further noted herein that the electrical interconnect arrangement shown and described in FIGS. 3A-3C is not to be regarded as a limitation of the present disclosure, unless noted otherwise herein. In this regard, the electrical interconnect arrangement may include any arrangement, array, or configuration of electrical interconnects 210 known in the art.

Reference will now be made to FIGS. 3B and 3C. In some embodiments, subsequent layers of the vertically integrated circuit assembly 200 may each include a plurality of electrical interconnects 210. For example, the second circuit assembly layer 204b may include a plurality of electrical interconnects 210g-210l, and the third circuit assembly layer 204c may include a plurality of electrical interconnects 210m-210r. In embodiments, the various circuit assembly layers 204a-204b may be fabricated such that the electrical interconnect arrangements on each of the surfaces of the various circuit assembly layers 204a-204b integrate and correspond and interface with one another.

For example, the plurality of electrical interconnects 210g-210l may form an electrical interconnect arrangement on a bottom surface of the second circuit assembly layer 204b which is configured to interface with the electrical interconnect arrangement on the top surface of the first circuit assembly layer 204a. Similarly, the plurality of electrical interconnects 210g-210l may form and an electrical interconnect arrangement on a top surface of the second circuit assembly layer 204b which is configured to interface with an electrical interconnect arrangement formed on a bottom surface of the third circuit assembly layer 204c formed by the plurality of electrical interconnects 210m-210r.

For instance, the electrical interconnect arrangements of the various circuit assembly layers 204a-204c may be configured to interface with one another such that the electrical interconnect 210a of the first circuit assembly layer 204a interfaces (e.g., is electrically coupled to) the electrical interconnect 210i of the second circuit assembly layer 204b, which is configured to interface with the electrical interconnect 210o of the third circuit assembly layer 204c. In this regard, an input signal 201 input into the vertically integrated circuit assembly 200 may be transmitted into the first circuit assembly layer 204a via electrical interconnect 210a, and may be subsequently transmitted into the second circuit assembly layer 204b and the third circuit assembly layer 204c via electrical interconnects 210i and 210o, respectively.

Accordingly, the interfacing of the various electrical interconnect arrangements of the various circuit assembly layers 204a-204c may create electrical pathways for electrical signals to be transmitted vertically between the layers of the vertically stacked circuit assembly 200 (e.g., substantially normal to the top surface of the substrate 202). In some embodiments, circuit assembly layers 204a-204c may be fabricated via one or more fabrication processes such that each circuit assembly layer 204a-204c includes a standardized/uniform electrical interconnect arrangement (e.g., electrical interconnect pattern, configuration, array, and the like) which is configured to interface with standardized/uniform electrical interconnect arrangements in other circuit assembly layers 204a-204c.

In embodiments, the various circuit assembly layers 204a-204c may be fabricated with standardized and/or uniform features, including a uniform structural footprint (e.g., uniform size, uniform shape), a uniform electrical footprint (e.g., uniform electrical interconnect arrangements), and the like. For example, the first circuit assembly layer 204a may include a first exterior perimeter, and the second circuit assembly layer 204b and the third circuit assembly layer 204c may include a second exterior perimeter and third exterior perimeter, respectively, which conforms (or substantially conforms) to the first exterior perimeter.

By fabricating circuit assembly layers 204a-204c with a standardized/uniform electrical interconnect arrangements, circuit assembly layers 204a-204c may be fabricated individually with varying functional blocks/integrated circuit components 208 in a modular manner. After fabricating each layer individually, the various circuit assembly layers 204a-204c may then be stacked in a particular orientation/order in order to form the vertically integrated circuit assembly 200. With standardized/uniform sizes and electrical interconnect arrangements, circuit assembly layers 204a-204b may be combined, modified, and/or interchanged in order to selectively adjust functional performance characteristics of the vertically integrated circuit assembly 200. Accordingly, embodiments of the present disclosure may facilitate the modular construction of layered vertically integrated circuit assemblies 200 in order to "mix-and-match" individual functions/components into varying configurations in order to provide more customized, bespoke solutions designed to meet different functional performance metrics and requirements.

It is further noted herein that fabricating each circuit assembly layer 204a-204c individually prior to forming the vertically integrated circuit assembly 200 may provide a number of fabrication and cost benefits as compared to previous approaches. For example, by fabricating each circuit assembly layer 204a-204c individually, each circuit assembly layer 204a-204c may be independently tested prior to assembly within the vertically integrated circuit assembly 200. This would allow the functional performance of each circuit assembly layer 204a-204c to be independently tested and verified prior to their integration within the rest of the vertically integrated circuit assembly 200. Accordingly, defective circuit assembly layers 204a-204c may be identified and discarded in order to ensure only circuit assembly layers 204a-204c with known good performance are integrated within the vertically integrated circuit assembly 200. This ability to identify defective layers may improve yields, reduce required re-work, reduce wasted materials, and improve cost considerations throughout the fabrication process.

In embodiments, the circuit assembly layers 204a-204c of the vertically integrated circuit assembly 200 may be bonded to one another in order to facilitate structural integrity and electrical conductivity within the vertically integrated circuit assembly 200. The various circuit assembly layers 204a-204c may be coupled to one another using any adhesive, bonding, or coupling technique known in the art. For example, in some embodiments, the bottom surface of the second circuit assembly layer 204b may be coupled to the top surface of the first circuit assembly layer 204a via one or more diffusion bonding processes including, but not limited to, transient liquid phase bonding processes. Transient liquid phase bonding is described in further detail in U.S. Pat. No. 7,830,021 B1, filed on Sep. 6, 2005, naming Ross K. Wilcoxon, Alan P. Boone, and James R. Wooldridge as inventors, which is incorporated herein by reference in the entirety. By way of another example, various circuit assembly layers 204a-204c may be coupled to one another by a conductive epoxy, sintered silver, solder, and the like.

In embodiments, each circuit assembly layer 204a-204c of the vertically integrated circuit assembly 200 may be configured to perform individualized functions. For example, as noted previously herein, the vertically integrated circuit assembly 200 may include a vertically integrated radio frequency multiplexer, wherein the first circuit assembly layer 204a includes a first bandpass filter layer, the second circuit assembly layer 204b includes a second bandpass filter layer, and the third circuit assembly layer 204c includes a third bandpass filter layer.

For instance, an input signal 201 may be input into the vertically integrated circuit assembly 200 via the first electrical trace 206a. The first circuit assembly layer 204a including one or more bandpass filters (e.g., integrated circuit components 208a-208d) may be configured to receive the input signal 201 via electrical interconnect 210a, and transmit a first output signal 203a via electrical interconnect 210b and electrical trace 206b. Continuing with the same example, the input signal 201 may be routed to the second circuit assembly layer 204b via the interfaced electrical interconnects 210a and 210i. The second circuit assembly layer 204b including one or more bandpass filters (e.g., integrated circuit components 208e-208h) may be configured to receive the input signal 201 via electrical interconnect 210i, and transmit a second output signal 203b via interfaced electrical interconnects 210g, 210c and electrical trace 206c. Similarly, the input signal 201 may be routed to the third circuit assembly layer 204c via the interfaced electrical interconnects 210a, 210i, 210o. The third circuit assembly layer 204c including one or more bandpass filters (e.g., integrated circuit components 208i-208l) may be configured to receive the input signal 201 via electrical interconnect 210o, and transmit a third output signal 203c via interfaced electrical interconnects 210q, 210k, 210d and electrical trace 206d.

In the context of vertically integrated radio frequency multiplexer (e.g., vertically integrated circuit assembly 200), the first bandpass filter layer (e.g., first circuit assembly layer 204a), the second bandpass filter layer (e.g., second circuit assembly layer 204b), and the third bandpass filter layer (e.g., third circuit assembly layer 204c) may be configured to generate output signals 203a-203c with varying characteristics. For example, the first output signal 203a generated by the first circuit assembly layer 204a may include a first bandwidth, the second output signal 203b generated by the second circuit assembly layer 204b may include a second bandwidth different from the first bandwidth, and the third output signal 203c generated by the third circuit assembly layer 204c may include a third bandwidth different from the first and/or second bandwidth.

While the vertically integrated circuit assembly 200 configured as a vertically integrated radio frequency multiplexer is shown and described herein as including three separate circuit assembly layers 204a-204c, this is not to be regarded as a limitation of the present disclosure, unless noted otherwise herein. For example, in some embodiments, the vertically integrated circuit assembly 200 may include five stacked circuit assembly layers 204a-204e. In this example, the substrate 202 may further include an additional electrical trace (not shown) electrically coupled to the electrical interconnect 210e, and an additional electrical trace (not shown) electrically coupled to the electrical interconnect 210f. In this regard, a fourth circuit assembly layer (not shown) may be configured to generate a fourth output signal (not shown) transmitted via the electrical trace (not shown) coupled to the electrical interconnect 210e, and a fifth circuit assembly layer (not shown) may be configured to generate a fifth output signal (not shown) transmitted via the electrical trace (not shown) coupled to the electrical interconnect 210f. It is noted herein that additional electrical interconnects 210 and/or electrical traces 206 may enable the vertically integrated circuit assembly 200 to generate additional output signals 203.

In additional embodiments, the vertically integrated circuit assembly 200 may be arranged/fabricated in order to address internal and/or external flux characteristics, such as heat flux, power flux, signal flux, and the like. For example, in some embodiments, active components (e.g., power amplifiers) may be disposed on the uppermost circuit assembly layer 204. For instance, as shown in FIG. 2, the power amplifiers and/or other active components (e.g., active integrated circuit components 208) may be included within the third circuit assembly layer 204c, the uppermost layer of the vertically integrated circuit assembly 200. Due to the fact that active components may generate the most heat and power, placing these active components on the uppermost circuit assembly layer 204 may simplify thermal management of the vertically integrated circuit assembly 200 by providing a clear and efficient thermal pathway for heat, noise, and power to be dissipated to ambient air. Additionally, by placing active components on the uppermost circuit assembly layer 204, interconnect lengths to and/or between passive components (e.g., passive integrated circuit components 208) may be reduced. Furthermore, such a configuration may enable active components to be changed, modified, and/or upgraded without altering or dismantling other circuit assembly layers 204 of the vertically integrated circuit assembly 200.

In some embodiments, the vertically integrated circuit assembly 200 may include one or more thermal management devices in one or more circuit assembly layers 204. In embodiments, thermal management devices may be disposed on the uppermost circuit assembly layer 204 of the vertically integrated circuit assembly 200. For example, as shown in FIG. 2, the third circuit assembly layer 204c may include one or more thermal management devices (e.g., integrated circuit components 208) including, but not limited to, a heat sink (e.g., finned heat sink), a heat pipe, a thermal spreader, or the like. It is noted herein that thermal management devices may facilitate an efficient thermal pathway for heat and power to be dissipated form the vertically integrated circuit assembly 200 to ambient.

In additional and/or alternative embodiments, active components and/or thermal management devices may be disposed in a bottom layer (e.g., first circuit assembly layer 204a) of the vertically integrated circuit assembly. Similar to the benefits provided by disposing these components on an uppermost layer, disposing active components and/or thermal management devices (e.g., integrated circuit components 208) on a bottom layer may facilitate heat and power dispersion through the substrate 202. Furthermore, additional bottom-side electrical interconnect (e.g., electrical traces 206) and other features/components disposed on the substrate 202 may further facilitate dispersion of heat and power away from the vertically integrated circuit assembly 200.

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

What is claimed:

1. A vertically integrated circuit assembly, comprising:
a substrate including a plurality of electrical traces;
a first circuit assembly layer disposed on the substrate, the first circuit assembly layer including:
a first set of integrated circuit components; and
a plurality of electrical interconnects configured to route signals through the first circuit assembly layer, wherein the plurality of electrical interconnects form an electrical interconnect arrangement on a top surface of the first circuit assembly layer; and
a second circuit assembly layer coupled to the top surface of the first circuit assembly layer, the second circuit assembly layer including:
a second set of integrated circuit components; and
a plurality of electrical interconnects configured to route signals through the second circuit assembly layer, the plurality of electrical interconnects forming an electrical interconnect arrangement on a bottom surface of the second circuit assembly layer configured to interface with the electrical interconnect arrangement on the top surface of the first circuit assembly layer, wherein the first set of integrated circuit components are configured to receive an input signal via a first electrical trace of the plurality of electrical traces, and transmit a first output signal via a second electrical trace of the plurality of electrical traces, the second set of integrated circuit components are configured to receive the input signal via a first electrical interconnect of the first circuit assembly layer, and transmit a second output signal via a second electrical interconnect of the first circuit assembly layer to a third electrical trace of the plurality of electrical traces, the first output signal includes a first bandwidth, and the second output signal includes a second bandwidth different from the first bandwidth.

2. The vertically integrated circuit assembly of claim 1, wherein the plurality of electrical interconnects of the second circuit assembly layer also form an electrical interconnect arrangement on a top surface of the second circuit assembly layer.

3. The vertically integrated circuit assembly of claim 2, further comprising:
at least one additional circuit assembly layer coupled to the top surface of the second circuit assembly layer, the at least one additional circuit assembly layer including:
at least one additional set of integrated circuit components; and
a plurality of electrical interconnects configured to route signals through the at least one additional circuit assembly layer, the plurality of electrical interconnects forming an electrical interconnect arrangement on a bottom surface of the at least one additional circuit assembly layer configured to interface with the electrical interconnect arrangement on the top surface of the second circuit assembly layer.

4. The vertically integrated circuit assembly of claim 3, wherein the at least one additional circuit assembly layer comprises a top circuit assembly layer, wherein the at least one additional circuit assembly layer includes at least one of a finned heat sink, a heat pipe, or a thermal spreader.

5. The vertically integrated circuit assembly of claim 1, wherein the vertically integrated circuit assembly comprises a vertically integrated radio frequency multiplexer.

6. The vertically integrated circuit assembly of claim 5, wherein the first circuit assembly layers comprises a first bandpass filter layer, and the second circuit assembly layer comprises a second bandpass filter layer.

7. The vertically integrated circuit assembly of claim 1, wherein the second circuit assembly layer is coupled to the top surface of the first circuit assembly layer via one or more transient liquid phase bonding processes.

8. The vertically integrated circuit assembly of claim 1, wherein the second circuit assembly layer is coupled to the top surface of the first circuit assembly layer via at least one of a conductive epoxy, sintered silver, or solder.

9. The vertically integrated circuit assembly of claim 1, wherein at least one of the first set of integrated circuit components or the second set of integrated circuit components include a power amplifier.

10. The vertically integrated circuit assembly of claim 1, wherein at least one of the first set of integrated circuit components or the second set of integrated circuit components include at least one of a switch or a bypass component.

11. The vertically integrated circuit assembly of claim 1, wherein an exterior perimeter of the second circuit assembly layer conforms to an exterior perimeter of the first circuit assembly layer.

12. A vertically integrated circuit assembly, comprising:
a substrate including a plurality of electrical traces;
a first circuit assembly layer disposed on the substrate, the first circuit assembly layer including:
a first set of integrated circuit components; and
a plurality of electrical interconnects configured to route signals through the first circuit assembly layer, wherein the plurality of electrical interconnects form an electrical interconnect arrangement on a top surface of the first circuit assembly layer; and
a second circuit assembly layer coupled to the top surface of the first circuit assembly layer, the second circuit assembly layer including:
a second set of integrated circuit components; and
a plurality of electrical interconnects configured to route signals through the second circuit assembly layer, the plurality of electrical interconnects forming an electrical interconnect arrangement on a bottom surface of the second circuit assembly layer configured to interface with the electrical interconnect arrangement on the top surface of the first circuit assembly layer, wherein the second circuit assembly layer is coupled to the top surface of the first circuit assembly layer via one or more transient liquid phase bonding processes.

13. The vertically integrated circuit assembly of claim 12, wherein the plurality of electrical interconnects of the second circuit assembly layer also form an electrical interconnect arrangement on a top surface of the second circuit assembly layer.

14. The vertically integrated circuit assembly of claim 13, further comprising:
at least one additional circuit assembly layer coupled to the top surface of the second circuit assembly layer, the at least one additional circuit assembly layer including:
at least one additional set of integrated circuit components; and
a plurality of electrical interconnects configured to route signals through the at least one additional circuit assembly layer, the plurality of electrical interconnects forming an electrical interconnect arrangement on a bottom surface of the at least one additional circuit assembly layer configured to interface with the electrical interconnect arrangement on the top surface of the second circuit assembly layer.

15. The vertically integrated circuit assembly of claim 14, wherein the at least one additional circuit assembly layer comprises a top circuit assembly layer, wherein the at least one additional circuit assembly layer includes at least one of a finned heat sink, a heat pipe, or a thermal spreader.

16. The vertically integrated circuit assembly of claim 12, wherein the vertically integrated circuit assembly comprises a vertically integrated radio frequency multiplexer.

17. The vertically integrated circuit assembly of claim 16, wherein the first circuit assembly layers comprises a first bandpass filter layer, and the second circuit assembly layer comprises a second bandpass filter layer.

18. The vertically integrated circuit assembly of claim 12, wherein the second circuit assembly layer is coupled to the top surface of the first circuit assembly layer via at least one of a conductive epoxy, sintered silver, or solder.

19. The vertically integrated circuit assembly of claim 12, wherein at least one of the first set of integrated circuit components or the second set of integrated circuit components include a power amplifier.

20. The vertically integrated circuit assembly of claim 1, wherein at least one of the first set of integrated circuit components or the second set of integrated circuit components include at least one of a switch or a bypass component.

* * * * *